United States Patent
Fu

(10) Patent No.: US 12,361,859 B2
(45) Date of Patent: Jul. 15, 2025

(54) DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Hua Fu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,419

(22) PCT Filed: Nov. 24, 2021

(86) PCT No.: PCT/CN2021/132839
§ 371 (c)(1),
(2) Date: Dec. 10, 2021

(87) PCT Pub. No.: WO2023/082336
PCT Pub. Date: May 19, 2023

(65) Prior Publication Data
US 2024/0013703 A1    Jan. 11, 2024

(30) Foreign Application Priority Data
Nov. 15, 2021    (CN) .......................... 202111347134.7

(51) Int. Cl.
G09G 3/20    (2006.01)
H05K 1/14    (2006.01)
H05K 1/18    (2006.01)

(52) U.S. Cl.
CPC ... *G09G 3/2096* (2013.01); *G09G 2310/0267* (2013.01); *G09G 2320/0209* (2013.01);
(Continued)

(58) Field of Classification Search
None
See application file for complete search history.

(56) References Cited

U.S. PATENT DOCUMENTS 9,425,166 B2 *   8/2016  Song ................... G02F 1/13454
11,257,455 B2 *  2/2022  Xiong ................. G09G 3/3677
(Continued)

FOREIGN PATENT DOCUMENTS

CN    102576169 A    7/2012
CN    103745707 A    4/2014
(Continued)

OTHER PUBLICATIONS

International Search Report in International application No. PCT/CN2021/132839, mailed on Aug. 11, 2022.
(Continued)

*Primary Examiner* — Fred Tzeng
(74) *Attorney, Agent, or Firm* — PV IP PC; Wei Te Chung

(57) ABSTRACT

A display device is provided, including a circuit board, a display panel, a plurality of clock signal lines, and a plurality of grounding capacitors. The display panel is connected to the circuit board. Each clock signal line extends from the circuit board to the display panel. The plurality of grounding capacitors are disposed on the circuit board. Each grounding capacitor is connected to a corresponding clock signal line.

17 Claims, 4 Drawing Sheets

(52) U.S. Cl.
CPC .............. *G09G 2320/0233* (2013.01); *G09G 2320/0257* (2013.01); *H05K 1/148* (2013.01); *H05K 1/189* (2013.01); *H05K 2201/10128* (2013.01)

(56) References Cited

U.S. PATENT DOCUMENTS

| | | | | |
|---|---|---|---|---|
| 11,468,811 | B2* | 10/2022 | Zhu | G09G 3/20 |
| 11,521,530 | B2* | 12/2022 | Xiao | G09G 3/20 |
| 11,741,914 | B1* | 8/2023 | Li | G09G 3/3674 345/87 |
| 11,804,161 | B1* | 10/2023 | Gao | G09G 3/2074 |
| 2012/0169681 | A1* | 7/2012 | Moriwaki | G02F 1/13452 345/204 |
| 2017/0249916 | A1* | 8/2017 | Jen | G09G 3/3677 |
| 2018/0315387 | A1* | 11/2018 | Park | G09G 3/3674 |
| 2019/0147790 | A1* | 5/2019 | Chung | G09G 3/006 345/213 |
| 2020/0273396 | A1* | 8/2020 | Lu | G09G 3/20 |
| 2020/0410951 | A1 | 12/2020 | Shin | |
| 2021/0118402 | A1* | 4/2021 | Cho | G09G 3/2096 |
| 2021/0295795 | A1* | 9/2021 | Xiong | G09G 3/3677 |
| 2021/0327383 | A1* | 10/2021 | He | G09G 3/3677 |
| 2022/0199039 | A1* | 6/2022 | Lee | G09G 3/3291 |
| 2022/0208059 | A1* | 6/2022 | Kim | G09G 3/20 |
| 2023/0092089 | A1* | 3/2023 | Zhang | G02F 1/133388 257/91 |

FOREIGN PATENT DOCUMENTS

| | | |
|---|---|---|
| CN | 107665660 A | 2/2018 |
| CN | 109523963 A | 3/2019 |
| CN | 209729473 U | 12/2019 |
| CN | 111091776 A | 5/2020 |
| CN | 111091792 A | 5/2020 |
| CN | 111429859 A | 7/2020 |
| CN | 111445831 A | 7/2020 |
| CN | 111624827 A | 9/2020 |
| CN | 113189808 A | 7/2021 |
| CN | 113419366 A | 9/2021 |
| JP | 2005084364 A | 3/2005 |
| KR | 20070118386 A | 12/2007 |

OTHER PUBLICATIONS

Written Opinion of the International Search Authority in International application No. PCT/CN2021/132839, mailed on Aug. 11, 2022.
Chinese Office Action issued in corresponding Chinese Patent Application No. 202111347134.7 dated Aug. 3, 2022, pp. 1-8.

* cited by examiner

VSS
LC1
LC2
CLK1
CLK2
CLK3
CLK4
CLK5
CLK6
CLK7
CLK8
CLK9
CLK10
CLK11
CLK12
DBS
CF_COM

FIG. 3

DISPLAY DEVICE

FIELD OF DISCLOSURE

The present disclosure relates to the field of display technologies, and in particular to a display device.

BACKGROUND

As display technologies mature, an existing thin film transistor liquid crystal display device (TFT-LCD) has achieved a narrow bezel design and ultra-high resolution (e.g., 8K), and is developing toward higher performance, such as large size, high resolution, and high contrast.

However, existing ultra-high resolution display devices are prone to various display defects, such as black and white horizontal lines, image crosstalk, and afterimages. These undesirable defects seriously affect display quality of the display device and customer's viewing experience. The black and white horizontal lines are caused by a large in-plane load of the ultra-high resolution display device. As a size of the display device increases, the in-plane load also increases. Specifically, for clock signal lines that are designed to be driven line by line within a surface of the display device (such as, a display surface of the display panel), there is a significant load difference between clock signal lines arranged in different lines. The display device displays a desired image by controlling light emission of a plurality of pixels disposed in the plane. The load difference between the clock signal lines will result in a difference in the potential of the pixel after charging, which in turn leads to a difference in brightness between different pixel rows. Therefore, there are dense black and white horizontal lines in the displayed image.

At present, an improvement solution for the above-mentioned defects is to adjust the in-plane load difference between the clock signal lines by changing a manufacturing process. However, this improvement solution cannot completely solve the load difference between the clock signal lines, and easily leads to problems, such as a decrease in product yield, a decrease in production capacity, and a decrease in efficiency.

Accordingly, it is necessary to provide a display device to solve the problems in the prior art.

SUMMARY OF DISCLOSURE

In order to solve the above-mentioned problems of the prior art, a purpose of the present disclosure is to provide a display device, which can improve a problem of a display device showing unexpected black and white horizontal lines.

To achieve the above purpose, the present disclosure provides a display device, including a processor configured to output driving signals and voltages; a timing controller connected to the processor, and configured to generate control signals based on the driving signals; a circuit board connected to the timing controller, and configured to generate clock signals according to the voltages and the control signals; a display panel connected to the circuit board, and including a display area and a non-display area; a plurality of clock signal lines configured to transmit the clock signals, wherein each of the clock signal lines extends from the circuit board to the non-display area of the display panel; a gate driver disposed in the non-display area of the display panel, connected to the clock signal lines, and configured to generate gate signals according to the clock signals; a gate line disposed in the display area of the display panel, connected to the gate driver, and configured to transmit the gate signals; and a plurality of grounding capacitors disposed on the circuit board, wherein each of the grounding capacitors is connected to a corresponding clock signal line.

In some embodiment, the plurality of clock signal lines are arranged in sequence from the display area to the non-display area of the display panel, and values of two of the grounding capacitors connected to two of the clock signal lines are different.

In some embodiment, X of the grounding capacitors connected to X of the clock signal lines arranged adjacent to an outer periphery of the display panel have a same value.

In some embodiment, the display device further includes a plurality of matching resistors disposed on the circuit board, wherein each of the matching resistors is connected in series with a corresponding clock signal line.

In some embodiment, each of the clock signal lines includes a first section and a second section connected to the first section, the first section is disposed on the circuit board, the second section is disposed on the non-display area of the display panel, and each of the grounding capacitors is connected to the first section of a corresponding clock signal line.

In some embodiment, the circuit board includes a first circuit board and a second circuit board; the first section of each clock signal line includes a first subsection and a second subsection, the first subsection is disposed on the first circuit board, and the second subsection is disposed on the second circuit board; the second section of each clock signal line includes a third subsection and a fourth subsection, which are respectively disposed on opposite sides of the display panel; the gate driver includes a first gate driver and a second gate driver, the first gate driver is connected to the third subsection, the second gate driver is connected to the fourth subsection, and the first gate driver and the second gate driver are respectively connected to opposite ends of the gate line; and each of the grounding capacitors includes a first grounding capacitor and a second grounding capacitor, the first grounding capacitor is disposed on the first circuit board and connected to the first subsection of the corresponding clock signal line, and the second grounding capacitor is disposed on the second circuit board and connected to the second subsection of the corresponding clock signal line.

The present disclosure also provides a display device, including: a circuit board; a display panel connected to the circuit board, and including a display area and a non-display area; a plurality of clock signal lines configured to transmit clock signals, wherein each of the clock signal lines extends from the circuit board to the non-display area of the display panel; a gate driver disposed in the non-display area of the display panel, connected to the clock signal lines, and configured to generate gate signals according to the clock signals; a gate line disposed in the display area of the display panel, connected to the gate driver, and configured to transmit the gate signals; and a plurality of grounding capacitors disposed on the circuit board, wherein each of the grounding capacitors is connected to a corresponding clock signal line.

In some embodiment, the plurality of clock signal lines are arranged in sequence from the display area to the non-display area of the display panel, and values of two of the grounding capacitors connected to two of the clock signal lines are different.

In some embodiment, X of the grounding capacitors connected to X of the clock signal lines arranged adjacent to an outer periphery of the display panel have a same value.

In some embodiment, the display device includes N of the clock signal lines, and a first clock signal line to an N-th clock signal line are arranged in sequence from the display area to the non-display area of the display panel, a value of the grounding capacitor connected to the N-th clock signal line is C(N), a value of the grounding capacitor connected to an (N−1)th clock signal line is C(N−1), and a value of the grounding capacitor connected to an (N−2)th clock signal line is C(N−2), wherein C(N)≠C(N−1)≠C(N−2).

In some embodiment, the values of the grounding capacitors connected to the N-th clock signal line, the (N−1)th clock signal line, and the (N−2)th clock signal line gradually decrease in order, such that C(N)<C(N−1)<C(N−2).

In some embodiment, the values of the grounding capacitors connected to the N-th clock signal line, the (N−1)th clock signal line, and the (N−2)th clock signal line gradually increase in order, such that C(N)>C(N−1)>C(N−2).

In some embodiment, Y of the grounding capacitors connected to Y of the clock signal lines adjacent to the display area of the display panel have a same value.

In some embodiment, the display device includes N of the clock signal lines, a first clock signal line to an N-th clock signal line are arranged in sequence from the display area to the non-display area of the display panel, a value of the grounding capacitor connected to the first clock signal line is C(1), a value of the grounding capacitor connected to a second clock signal line is C(2), and a value of the grounding capacitor connected to a third clock signal line is C(3), wherein C(1)≠C(2)≠C(3).

In some embodiment, the display device further includes a plurality of matching resistors disposed on the circuit board, wherein each of the matching resistors is connected in series with a corresponding clock signal line.

In some embodiment, X of the matching resistors connected to X of the clock signal lines arranged adjacent to an outer periphery of the display panel have a first resistance value; and the matching resistors connected to remaining clock signal lines have a second resistance value, and the second resistance value is less than the first resistance value.

In some embodiment, each of the clock signal lines includes a first section and a second section connected to the first section, the first section is disposed on the circuit board, the second section is disposed on the non-display area of the display panel, and each of the grounding capacitors is connected to the first section of a corresponding clock signal line.

In some embodiment, the circuit board includes a first circuit board and a second circuit board; the first section of each clock signal line includes a first subsection and a second subsection, the first subsection is disposed on the first circuit board, and the second subsection is disposed on the second circuit board; the second section of each clock signal line includes a third subsection and a fourth subsection, which are respectively disposed on opposite sides of the display panel; the gate driver includes a first gate driver and a second gate driver, the first gate driver is connected to the third subsection, the second gate driver is connected to the fourth subsection, and the first gate driver and the second gate driver are respectively connected to opposite ends of the gate line; and each of the grounding capacitors includes a first grounding capacitor and a second grounding capacitor, the first grounding capacitor is disposed on the first circuit board and connected to the first subsection of the corresponding clock signal line, and the second grounding capacitor is disposed on the second circuit board and connected to the second subsection of the corresponding clock signal line.

In some embodiment, the first grounding capacitor and the second grounding capacitor connected to a same clock signal line have a same value.

In some embodiment, the first grounding capacitor and the second grounding capacitor connected to a same clock signal line have different values.

In comparison with the prior art, the present disclosure optimizes a circuit design of the clock signal lines and eliminate a load difference of the clock signal lines by setting the grounding capacitors and the matching resistors connected to the clock signal lines on the circuit board of the display device, thereby solving the problem of unexpected black and white horizontal lines appearing on a display image, and a product yield and product quality are greatly improved.

BRIEF DESCRIPTION OF DRAWINGS

The following describes specific embodiments of the present disclosure in detail with reference to accompanying drawings to make technical solutions and other beneficial effects of the present disclosure obvious.

FIG. 3 shows a schematic diagram of a wiring region of a non-display area of a display panel of the display device of FIG. 1.

DETAILED DESCRIPTION

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts shall fall within a protection scope of the present disclosure.

Figure 1:
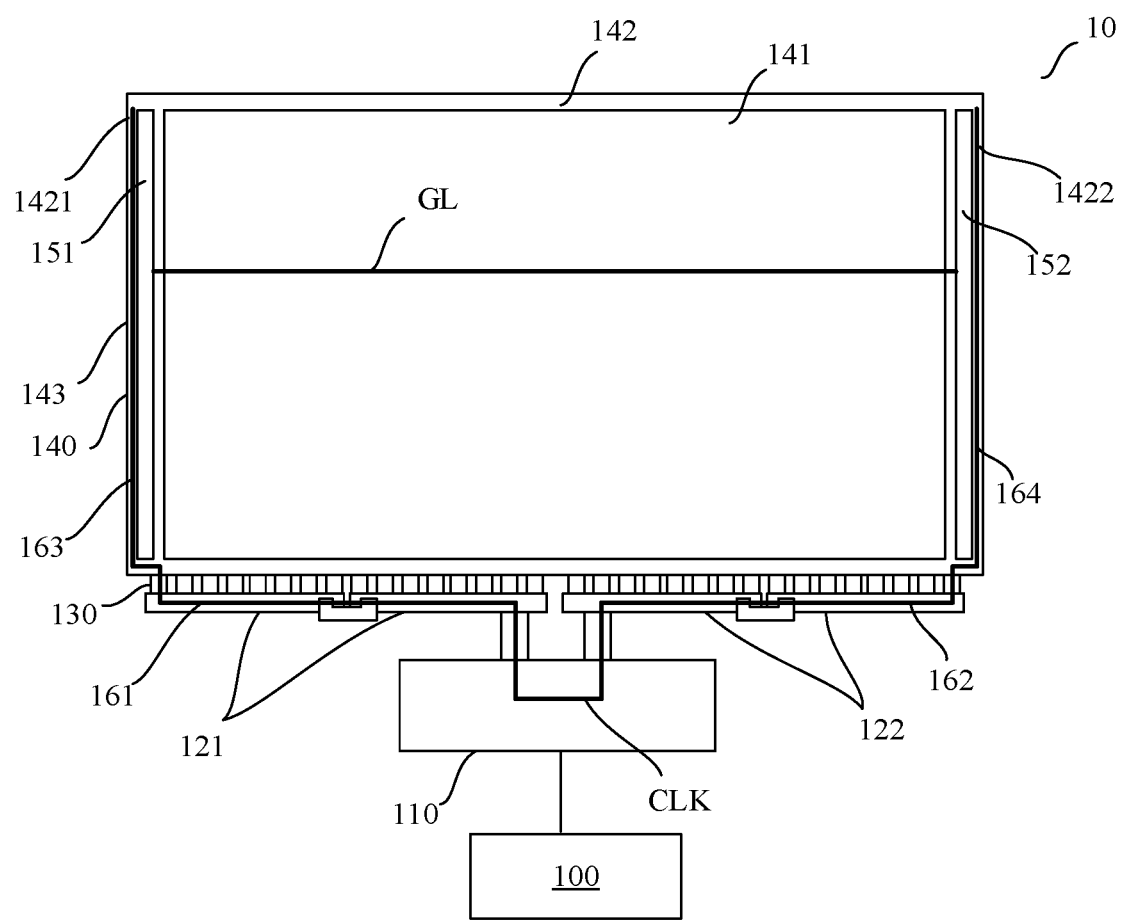
FIG. 1 shows a schematic diagram of a display device according to an embodiment of the present disclosure.

Referring to FIG. 1, which shows a schematic diagram of a display device 10 according to an embodiment of the present disclosure. The display device 10 includes a processor 100, a timing controller 110, a first circuit board 121, a second circuit board 122, flexible circuit boards 130, a display panel 140, a first gate driver 151, a second gate driver 152, and a source driver. The timing controller 110 is connected to the processor 100. The first circuit board 121 and the second circuit board 122 are connected to the timing controller 110, and are respectively connected to the display panel 140 through a corresponding one of the flexible circuit boards 130. The display panel 140 includes a display area 141, and a non-display area 142 surrounding the display area 141. The first gate driver 151 and the second gate driver 152 are respectively disposed on opposite sides of the display panel 140, and arranged in the non-display area 142 between an outer periphery 143 of the display panel 140 and the display area 141. The source driver can be integrated in the first circuit board 121 and the second circuit board 122, or integrated in the flexible circuit boards 130, or disposed in the non-display area 142 of the display panel 140, but it is not limited thereto. The display area 141 of the display panel 140 includes a plurality of gate lines GL, a plurality of data lines, and a plurality of pixels. Each gate line GL can drive at least one row of pixels. The first gate driver 151 and the second gate driver 152 are correspondingly connected to the gate lines GL, and are respectively connected to opposite ends of the gate line GL. The source driver is connected to the data lines.

Figure 2:
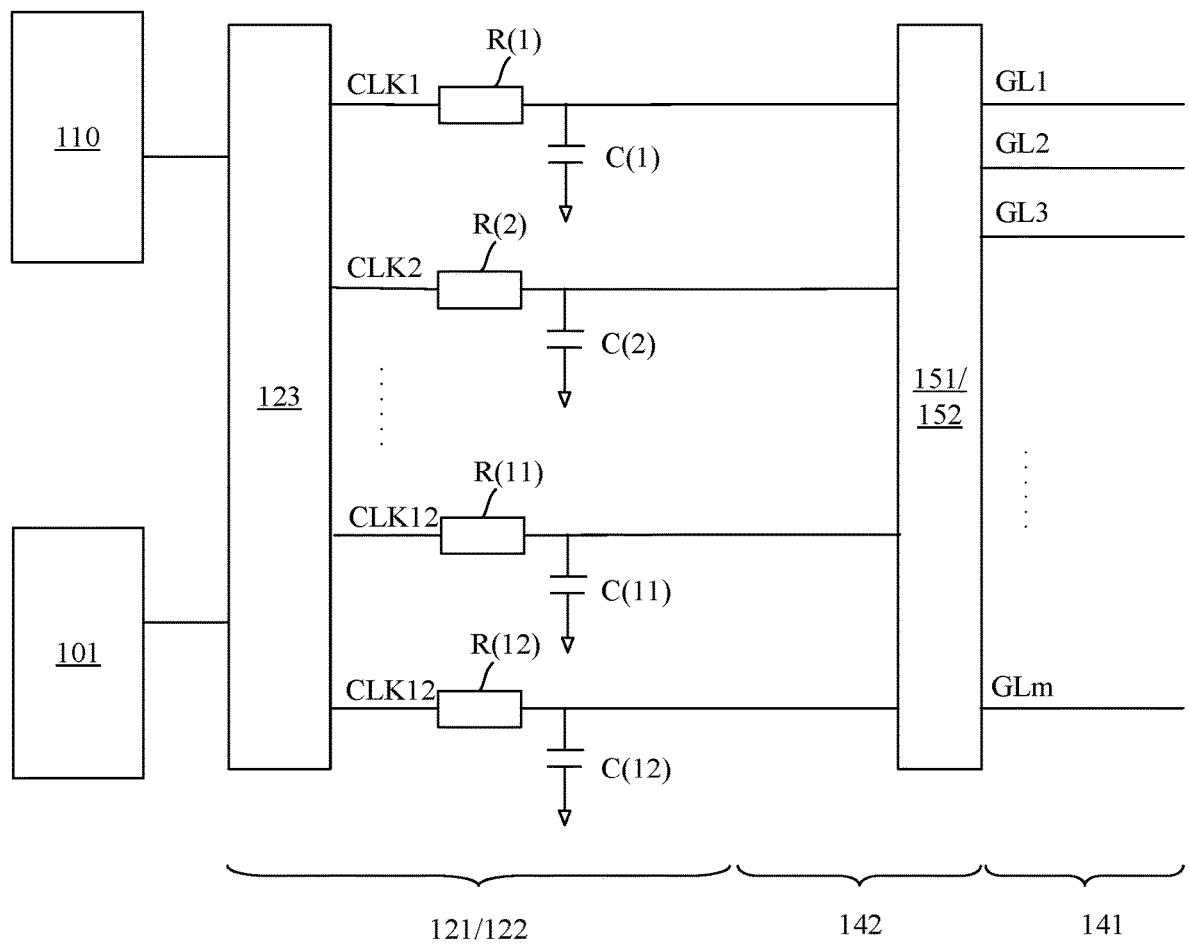
FIG. 2 shows a partial circuit block diagram of the display device of FIG. 1.

Referring to FIG. 1 and FIG. 2, FIG. 2 shows a partial circuit block diagram of the display device of FIG. 1. The display device 10 also includes a voltage generating unit 101 and a timing generating unit 123. In this embodiment, the voltage generating unit 101 may be disposed in the processor 100, and the timing generating unit 123 may be disposed in the first circuit board 121 and the second circuit board 122. The timing generating unit 123 is connected to the voltage generating unit 101 and the timing controller 110. The timing generating unit 123 is connected to the first gate driver 151 and the second gate driver 152 through a plurality of signal lines, such as clock signal lines CLK, a scanning start signal line, a scanning sequence control signal line, and so on. In this embodiment, the signal lines between the timing generating unit 123 of the first circuit board 121 and the first gate driver 151 include twelve clock signal lines (CLK1 to CLK12). The signal lines between the timing generating unit 123 of the second circuit board 122 and the second gate driver 152 also includes twelve clock signal lines (CLK1 to CLK12). It should be understood that other numbers of clock signal lines CLK may be used in other embodiments, and it is not limited thereto.

As shown in FIG. 1 and FIG. 2, in this embodiment, the processor 100 outputs driving signals, such as image signals, enable signals, vertical synchronization signals, horizontal synchronization signals, and clock signals. The timing controller 110 receives the above-mentioned driving signals from the processor 100. The timing controller 110 generates data control signals based on the driving signals. The source driver generates data signals according to the data control signals and outputs them to the corresponding data line. Furthermore, the voltage generating unit 101 provides voltages to the timing generating unit 123. The timing controller 110 generates control signals based on the driving signals. The timing generating unit 123 generates gate control signals, including such as clock signals, according to the voltages and the control signals, and controls the corresponding clock signal line CLK to transmit the clock signal to the first gate driver 151 and/or the second gate driver 152. The first gate driver 151 and the second gate driver 152 generate gate signals based on the gate control signals, such as the clock signals, and output them to the corresponding gate lines. The pixels in the display panel 140 display images in response to the data signals and the gate signals.

As shown in FIG. 1, the non-display area 142 of the display panel 140 includes a first wiring region 1421 and a second wiring region 1422. The first wiring region 1421 is arranged between the first gate driver 151 and the outer periphery 143 of the display panel 140, and the second wiring region 1422 is arranged between the second gate driver 152 and the outer periphery 143 of the display panel 140.

As shown in FIG. 1 and FIG. 2, each clock signal line CLK extends from the circuit board 121/122 to the wiring region 1421/1422 of the non-display area 142 of the display panel 140. Specifically, the same clock signal line CLK (such as, a first clock signal line CLK1) includes a first section disposed in the circuit board 121/122 and a second section disposed in the display panel 140. Since this embodiment adopts a dual gate driving technology, the same clock signal line CLK will extend on opposite sides of the display device 10.

As shown in FIG. 1, in one clock signal line CLK, the first section of the clock signal line CLK includes a first subsection 161 disposed on the first circuit board 121 and a second subsection 162 disposed on the second circuit board 122. The second section of the clock signal line CLK includes a third subsection 163 disposed on the first wiring region 1421 and a fourth subsection 164 disposed on the second wiring region 1422. The first subsection 161 and the second subsection 162 receive clock signals generated based on the same signal of the timing controller 110, that is, the first subsection 161 and the second subsection 162 are used to transmit the same clock signal. The first subsection 161 is connected to the third subsection 163, and the second subsection 162 is connected to the fourth subsection 164. The third subsection 163 is connected to the first gate driver 151, and the fourth subsection 164 is connected to the second gate driver 152. The first gate driver 151 and the second gate driver 152 control the same gate line GL based on the same clock signal.

It should be noted that different clock signal lines CLK may have load differences due to panel manufacturing process differences, which will affect the clock signals transmitted to the display panel 140. Secondly, manufacturing process differences of the circuit board 121/122, design differences (e.g., structural design, wiring layout design, etc.) of the display panel 140 and the circuit board 121/122 will also cause the above-mentioned load difference problem. For example, refer to FIG. 3, which shows a schematic diagram of the wiring region 1421/1422 of the non-display area 142 of the display panel 140 of the display device of FIG. 1. In the wiring region 1421/1422 of the display panel 140, from the non-display area 142 (or the outer periphery 143) to the display area 141 of the display panel 140, a common electrode line CF_COM of a color filter substrate, a DBS (data line bm less) common electrode line DBS, a twelfth clock signal line CLK12 to the first clock signal line CLK1, a second pull-down circuit control signal line LC2, a first pull-down circuit control signal line LC1, and a reference potential line VSS are arranged in sequence. In the display panel 140, the clock signals of each clock signal line CLK are coupled with the surrounding signal lines. Due to the influence of the wiring design, different clock signals will cause different amounts of coupling, which in turn causes different loads between different clock signal lines. In order to improve the load difference between the clock signal lines, the display device of the present disclosure also includes the grounding capacitors connected to the clock signal lines, as detailed below.

As shown in FIG. 1 and FIG. 2, the grounding capacitors C are disposed on the circuit board 121/122 and connected to the first section of the corresponding clock signal line CLK. Specifically, refer to FIG. 4, which shows a circuit diagram of a clock signal line according to an embodiment of the present disclosure. The grounding capacitor C connected to the same clock signal line CLK includes a first grounding capacitor CL1 and a second grounding capacitor CR1. The first grounding capacitor CL1 is disposed on the first circuit board 121 and connected to the first subsection 161 of the clock signal line CLK. The second grounding capacitor CR1 is disposed on the second circuit board 122 and connected to the second subsection 162 of the clock signal line CLK. The third subsection 163 of the clock signal line CLK carries a first load (including a first load resistance RL2 and a first load capacitance CL2) due to process differences and wiring layout. Similarly, the fourth subsection 164 of the clock signal line CLK carries a second load (including a second load resistor RR2 and a second load capacitor CR2). In addition, the gate line GL driven based on the same clock signals also carries a third load (including a third load resistor R3 and a third load capacitor C3). The same clock signal line CLK, the RC circuits of the first grounding capacitor CL1 and the second grounding capacitor CR1, and the corresponding RC circuit of the gate line GL constitute an electronic circuit. A current of the clock signal line CLK on the display panel is I1, a current of the clock signal line CLK on the first circuit board 121 is I2, and a current of the clock signal line CLK on the second circuit board 122 is I3. A total current I of the clock signal line CLK is I1+I2+I3. Therefore, in this embodiment, by providing the first grounding capacitor CL1 and the second grounding capacitor CR1, a stable output of the clock signal line CLK can be enhanced.

In the present disclosure, the grounding capacitors C are disposed on the circuit board 121/122 instead of the wiring region 1421/1422 of the display panel 140. Therefore, the grounding capacitors C can be prevented from occupying a wiring space of the display panel 140, and the grounding capacitors C can be prevented from increasing a load of the display panel 140.

It should be noted that a value of the grounding capacitor C is determined according to a wiring position of the clock signal line connected to it, such that at least two grounding capacitors have different values. Specifically, in this embodiment, considering the difference in wiring positions of different clock signal lines, values of X of the grounding capacitors C connected to X of the clock signal lines arranged on the outermost periphery (i.e., adjacent to the outer periphery of the display panel) range from 0.2 to 1 nano-farad. Alternatively, the aforementioned X of the clock signal lines include a seventh clock signal line CLK7 to a twelfth clock signal line CLK12, or include an eighth clock signal line CLK8 to an eleventh clock signal line CLK11. In addition, values of Y of the grounding capacitors C connected to Y of the clock signal lines arranged on the innermost side (i.e., adjacent to the display area of the display panel) range from 0 and 0.8 nano-farads. Alternatively, in all of the clock signal lines, the clock signal lines other than the aforementioned designated X of the clock signal lines are the aforementioned Y of the clock signal lines.

In some embodiments, the display device 10 includes N of the clock signal lines, and a first clock signal line to an N-th clock signal line are arranged in sequence from the display area 141 to the non-display area 142 of the display panel 140. The values of X of the grounding capacitors C connected to X of the clock signal lines arranged on the outermost periphery are different from the values of Y of the grounding capacitors C connected to Y of the clock signal lines arranged on the innermost side. By designing values of two of the grounding capacitors corresponding to two of the clock signal lines to be different, the load difference caused by the different wiring positions of the clock signal lines can be eliminated. In addition, since the wiring difference between two adjacent clock signal lines is small, the values of X of the grounding capacitors C connected to X of the clock signal lines arranged on the outermost periphery are designed to be the same. For example, a value of the grounding capacitor connected to the N-th clock signal line is C(N), a value of the grounding capacitor connected to the (N−1)th clock signal line is C(N−1), and a value of the grounding capacitor connected to the (N−2)th clock signal line is C(N−2), where C(N)=C(N−1)=C(N−2). By adopting the design of the same value for part of the adjacent grounding capacitors C, it is beneficial to reduce the manufacturing complexity of the circuit board 121/122, and improve the yield and productivity.

In some embodiments, the display device 10 includes N of the clock signal lines, and a first clock signal line to an N-th clock signal line are arranged in sequence from the display area 141 to the non-display area 142 of the display panel 140. The values of X of the grounding capacitors C connected to X of the clock signal lines arranged on the outermost periphery are different from the values of Y of the grounding capacitors C connected to Y of the clock signal lines arranged on the innermost side. In addition, because there are different process differences between different clock signal lines, and different clock signals have different coupling values due to a cascade relationship, X of the grounding capacitors C connected to X of the clock signal lines arranged on the outermost periphery can be designed to be totally or mostly different in value. For example, a value of the grounding capacitor connected to the N-th clock signal line is C(N), a value of the grounding capacitor connected to the (N−1)th clock signal line is C(N−1), and a value of the grounding capacitor connected to the (N−2)th clock signal line is C(N−2), where C(N)≠C(N−1)≠C(N−2). In response to the different values of X of the grounding capacitors connected to X of the clock signal lines arranged on the outermost periphery, the values can be arranged in an orderly or disorderly manner, where solutions of the ordered manner include gradual changes. Specifically, the values of the grounding capacitors C gradually increase in order (i.e., C(N)>C(N−1)>C(N−2)) or decrease in order (i.e., C(N)<C(N−1)<C(N−2)). In some embodiments, the values of the grounding capacitors C are an arithmetic sequence with a tolerance of 0.1 nano-farads (nf). For example, values of the grounding capacitors C connected to the ninth clock signal line CLK9 to the twelfth clock signal line CLK12 are 0.2 nf, 0.3 nf, 0.4 nf, and 0.5 nf. In this embodiment, all or most of the grounding capacitors C are designed with different resistance values, which has a better effect on improving the black and white horizontal lines.

In some embodiments, the display device 10 includes N of the clock signal lines, and a first clock signal line to an N-th clock signal line are arranged in sequence from the display area 141 to the non-display area 142 of the display panel 140. The values of X of the grounding capacitors C connected to X of the clock signal lines arranged on the outermost periphery are different from the values of Y of the grounding capacitors C connected to Y of the clock signal lines arranged on the innermost side. Furthermore, the values of Y of the grounding capacitors C connected to Y of the clock signal lines arranged on the innermost side are designed to be the same. For example, a value of the grounding capacitor connected to the first clock signal line is C(1), a value of the grounding capacitor connected to the second clock signal line is C(2), and a value of the grounding capacitor connected to the third clock signal line is C(3), where C(1)=C(2)=C(3). By adopting the design of the same value for part of the adjacent grounding capacitors C, it is beneficial to reduce the manufacturing complexity of the circuit board 121/122, and improve the yield and productivity.

In some embodiments, the display device 10 includes a plurality of clock signal lines arranged in sequence from the display area 141 to the non-display area 142 of the display panel 140. The values of X of the grounding capacitors C connected to X of the clock signal lines arranged on the outermost periphery are different from the values of Y of the grounding capacitors C connected to Y of the clock signal lines arranged on the innermost side. Furthermore, considering the different manufacturing process and wiring differences between different clock signal lines, the values of Y of the grounding capacitors connected to Y of the clock signal lines arranged on the innermost side can be designed to be different. For example, a value of the grounding capacitor connected to the first clock signal line is C(1), a value of the grounding capacitor connected to the second clock signal line is C(2), and a value of the grounding capacitor connected to the third clock signal line is C(3), where C(1)≠C(2)≠C(3). In response to the different values of Y of the grounding capacitors C, the values can be arranged in an orderly or disordered manner, where solutions OF the ordered manner include gradual changes. Specifically, the values of the grounding capacitors C gradually increase in order (i.e., C(1)<C(2)<C(3)) or decrease in order (i.e., C(1)>C(2)>C(3)). In some embodiments, the values of the grounding capacitors C are an arithmetic sequence with a tolerance of 0.05 nano-farads (nf). For example, values of the grounding capacitors C connected to the first clock signal line CLK1 to the eighth clock signal line CLK8 are 0 nf, 0.05 nf, 0.1 nf, 0.15 nf, 0.2 nf, 0.25 nf, 0.3 nf, and 0.35 nf. In this embodiment, all or most of the grounding capacitors C are designed with different resistance values, which has a better effect on improving the black and white horizontal lines. Alternatively, in the foregoing embodiment, the grounding capacitors C connected to the ninth clock signal line CLK9 to the twelfth clock signal line CLK12 may have the same value, such as 0.2 nf, or different values.

In some embodiments, the first grounding capacitor CL1 and the second grounding capacitor CR1 of the grounding capacitor C connected to the same clock signal line CLK may be the same (for example, the value of the above grounding capacitor C is equal to that of the first grounding capacitor CL1 and the second grounding capacitor CR1). By using the same capacitance design for the first grounding capacitor CL1 and the second grounding capacitor CR1 connected to the same clock signal line CLK, it is beneficial to reduce manufacturing complexity, improve yield and productivity.

In some embodiments, considering that the same clock signal line CLK may have process differences and wiring differences on both sides of the display device 10, the first grounding capacitor CL1 and the second grounding capacitor CR1 of the grounding capacitor C connected to the same clock signal line CLK may be designed to be different. This design can effectively improve the load difference of the same clock signal line on different sides of the display device.

Figure 4:
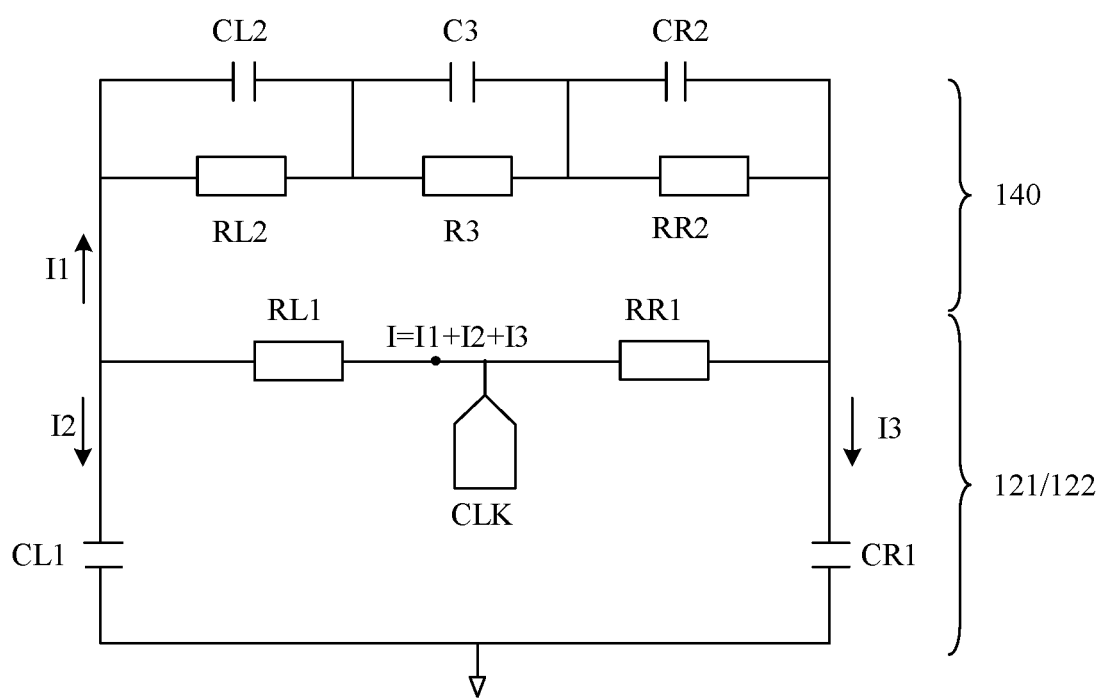
FIG. 4 shows a circuit diagram of a clock signal line according to an embodiment of the present disclosure.

As shown in FIG. 2 and FIG. 4, the display device 10 also includes a plurality of matching resistors R1, which are disposed on the circuit board 121/122, and each matching resistor R1 is connected in series with the first section of the corresponding clock signal line CLK. Specifically, the matching resistor R1 connected to the same clock signal line CLK includes a first matching resistor RL1 and a second matching resistor RR1. The first matching resistor RL1 is disposed on the first circuit board 121 and connected to the first subsection 161 of the clock signal line CLK. The second matching resistor RR1 is disposed on the second circuit board 122 and connected to the second subsection 162 of the clock signal line CLK.

In the manufacturing process of the display device 10, the grounding capacitor C is set first, and then the matching resistor R1 is set. Specifically, a lighting test is performed on the display device 10 to confirm the image quality. If horizontal dense lines appear in the screen, all the clock signals are detected to determine the load difference between the clock signal lines. Then, through the above-mentioned design solution of the grounding capacitor C, the load difference between the clock signal lines is eliminated. Therefore, the output stability of clock signals can be enhanced, thereby eliminating black and white horizontal lines and improving display quality. Then, a resistance of the clock signal line CLK on the circuit board 121/122 is referenced to find the clock signal line CLK causing the dark line, and a series resistance matching is performed on the clock signal line CLK. Therefore, the matching resistor R1 can further solve the problem of black and white horizontal lines. It can be seen from the above that the setting of grounding capacitors C and the matching resistors R1 can effectively reduce the charging difference of different clock signals of clock signal lines CLK to pixel rows, thereby improving the brightness uniformity of each pixel row, eliminating the problem of black and white horizontal lines, and improving the image quality.

In some embodiments, X of the matching resistors R1 connected to X of the clock signal lines CLK arranged on the outermost periphery have a first resistance value. Furthermore, the matching resistors R1 connected to remaining clock signal lines CLK have a second resistance value. The second resistance value is less than the first resistance value. In some embodiments, the first resistance value ranges from 10 to 80 ohms, and the second resistance value is 2 to 15 ohms lower than the first resistance value. It should be understood that the multiple first resistance values may be the same or different values. Similarly, the multiple second resistance values may also be the same or different values.

The above-mentioned embodiments are described with a display device adopting a dual gate driving technology. It should be understood that the present disclosure is also applicable to display devices using a single gate drive technology. The principle and design of grounding capacitors and matching resistors are similar to those of the above-mentioned dual gate drive technology, and will not be repeated here.

In summary, the present disclosure optimizes the circuit design of the clock signal lines and eliminate the load difference of the clock signal lines by setting the grounding capacitors and the matching resistors connected to the clock signal lines on the circuit board of the display device, thereby solving the problem of unexpected black and white horizontal lines shown on a display image, and a product yield and product quality are greatly improved.

The above is a detailed introduction to the display device of the embodiments of the present disclosure. Specific embodiments are used in this specification to illustrate the principles and implementations of the present disclosure. The descriptions of the above embodiments are only used to help understand the technical solutions and core ideas of the present disclosure. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present disclosure.

What is claimed is:

1. A display device, comprising:
  a processor configured to output driving signals and voltages;
  a timing controller connected to the processor, and configured to generate control signals based on the driving signals;

a circuit board connected to the timing controller, and configured to generate clock signals according to the voltages and the control signals;

a display panel connected to the circuit board, and comprising a display area and a non-display area; wherein the circuit board is disposed outside the display panel;

a plurality of clock signal lines configured to transmit the clock signals, wherein each of the clock signal lines extends from the circuit board to the non-display area of the display panel;

a gate driver disposed in the non-display area of the display panel, connected to the clock signal lines, and configured to generate gate signals according to the clock signals;

a gate line disposed in the display area of the display panel, connected to the gate driver, and configured to transmit the gate signals; and a plurality of grounding capacitors disposed on the circuit board, wherein each of the grounding capacitors is connected to a corresponding clock signal line;

wherein each of the clock signal lines comprises a first section and a second section connected to the first section, the first section is disposed on the circuit board, the second section is disposed on the non-display area of the display panel, and each of the grounding capacitors is connected to the first section of a corresponding clock signal line; and wherein capacitance values of a first subset X of the grounding capacitors connected to a corresponding first subset X of the clock signal lines arranged adjacent to an outer periphery of the display panel are different from capacitance values of a second subset Y of the grounding capacitors connected to a corresponding second subset Y of the clock signal lines arranged adjacent to the display area of the display panel, and the capacitance values of the first subset X of the grounding capacitors connected to the corresponding first subset X of the clock signal lines arranged adjacent to the outer periphery of the display panel are the same as each other.

2. The display device according to claim 1, wherein the plurality of clock signal lines are arranged in sequence from the display area to the non-display area of the display panel, and capacitance values of two of the grounding capacitors connected to two of the clock signal lines are different from each other.

3. The display device according to claim 1, wherein the capacitance values of the second subset Y of the grounding capacitors connected to the corresponding second subset Y of the clock signal lines arranged adjacent to the display area of the display panel are the same as each other.

4. The display device according to claim 1, further comprising a plurality of matching resistors disposed on the circuit board, wherein each of the matching resistors is connected in series with a corresponding clock signal line.

5. The display device according to claim 1, wherein the circuit board comprises a first circuit board and a second circuit board;

the first section of each clock signal line comprises a first subsection and a second subsection, the first subsection is disposed on the first circuit board, and the second subsection is disposed on the second circuit board;

the second section of each clock signal line comprises a third subsection and a fourth subsection, which are respectively disposed on opposite sides of the display panel;

the gate driver comprises a first gate driver and a second gate driver, the first gate driver is connected to the third subsection, the second gate driver is connected to the fourth subsection, and the first gate driver and the second gate driver are respectively connected to opposite ends of the gate line; and each of the grounding capacitors comprises a first grounding capacitor and a second grounding capacitor, the first grounding capacitor is disposed on the first circuit board and connected to the first subsection of the corresponding clock signal line, and the second grounding capacitor is disposed on the second circuit board and connected to the second subsection of the corresponding clock signal line.

6. A display device, comprising:

a circuit board;

a display panel connected to the circuit board, and comprising a display area and a non-display area; wherein the circuit board is disposed outside the display panel;

a plurality of clock signal lines configured to transmit clock signals, wherein each of the clock signal lines extends from the circuit board to the non-display area of the display panel;

a gate driver disposed in the non-display area of the display panel, connected to the clock signal lines, and configured to generate gate signals according to the clock signals;

a gate line disposed in the display area of the display panel, connected to the gate driver, and configured to transmit the gate signals; and a plurality of grounding capacitors disposed on the circuit board, wherein each of the grounding capacitors is connected to a corresponding clock signal line;

wherein each of the clock signal lines comprises a first section and a second section connected to the first section, the first section is disposed on the circuit board, the second section is disposed on the non-display area of the display panel, and each of the grounding capacitors is connected to the first section of a corresponding clock signal line; and wherein capacitance values of a first subset X of the grounding capacitors connected to a corresponding first subset X of the clock signal lines arranged adjacent to an outer periphery of the display panel are different from capacitance values of a second subset Y of the grounding capacitors connected to a corresponding second subset Y of the clock signal lines arranged adjacent to the display area of the display panel, and the capacitance values of the first subset X of the grounding capacitors connected to the corresponding first subset X of the clock signal lines arranged adjacent to the outer periphery of the display panel are the same as each other.

7. The display device according to claim 6, wherein the plurality of clock signal lines are arranged in sequence from the display area to the non-display area of the display panel, and capacitance values of two of the grounding capacitors connected to two of the clock signal lines are different from each other.

8. The display device according to claim 6, wherein the display device comprises a number N of the clock signal lines, and a first clock signal line to an N-th clock signal line are arranged in sequence from the display area to the non-display area of the display panel, a capacitance value of the grounding capacitor connected to the N-th clock signal line is $C(N)$, a capacitance value of the grounding capacitor connected to an $(N-1)$th clock signal line is $C(N-1)$, and a capacitance value of the grounding capacitor connected to an (N−2)th clock signal line is C(N−2), wherein C(N)≠C(N−1)≠C(N−2).

9. The display device according to claim 8, wherein the capacitance values of the grounding capacitors connected to the N-th clock signal line, the (N−1)th clock signal line, and the (N−2)th clock signal line gradually decrease in order, such that C(N)<C(N−1)<C(N−2).

10. The display device according to claim 8, wherein the capacitance values of the grounding capacitors connected to the N-th clock signal line, the (N−1)th clock signal line, and the (N−2)th clock signal line gradually increase in order, such that C(N)>C(N−1)>C(N−2).

11. The display device according to claim 6, wherein the capacitance values of the second subset Y of the grounding capacitors connected to the corresponding second subset Y of the clock signal lines arranged adjacent to the display area of the display panel are the same as each other.

12. The display device according to claim 6, wherein the display device comprises a number N of the clock signal lines, a first clock signal line to an N-th clock signal line are arranged in sequence from the display area to the non-display area of the display panel, a capacitance value of the grounding capacitor connected to the first clock signal line is C(1), a capacitance value of the grounding capacitor connected to a second clock signal line is C(2), and a capacitance value of the grounding capacitor connected to a third clock signal line is C(3), wherein C(1)≠C(2)≠C(3).

13. The display device according to claim 6, wherein-further comprising a plurality of matching resistors disposed on the circuit board, wherein each of the matching resistors is connected in series with a corresponding clock signal line.

14. The display device according to claim 13, wherein a subset X of the matching resistors, which are connected to the corresponding subset X of the clock signal lines arranged adjacent to the outer periphery of the display panel, have a first resistance value; and the matching resistors connected to remaining clock signal lines have a second resistance value, and the second resistance value is less than the first resistance value.

15. The display device according to claim 6, wherein the circuit board comprises a first circuit board and a second circuit board;
the first section of each clock signal line comprises a first subsection and a second subsection, the first subsection is disposed on the first circuit board, and the second subsection is disposed on the second circuit board;
the second section of each clock signal line comprises a third subsection and a fourth subsection, which are respectively disposed on opposite sides of the display panel;
the gate driver comprises a first gate driver and a second gate driver, the first gate driver is connected to the third subsection, the second gate driver is connected to the fourth subsection, and the first gate driver and the second gate driver are respectively connected to opposite ends of the gate line; and
each of the grounding capacitors comprises a first grounding capacitor and a second grounding capacitor, the first grounding capacitor is disposed on the first circuit board and connected to the first subsection of the corresponding clock signal line, and the second grounding capacitor is disposed on the second circuit board and connected to the second subsection of the corresponding clock signal line.

16. The display device according to claim 15, wherein the first grounding capacitor and the second grounding capacitor connected to a same clock signal line have a same capacitance value.

17. The display device according to claim 15, wherein the first grounding capacitor and the second grounding capacitor connected to a same clock signal line have different capacitance values.

* * * * *